United States Patent [19]

Fletcher et al.

[11] Patent Number: 5,008,718

[45] Date of Patent: Apr. 16, 1991

[54] LIGHT-EMITTING DIODE WITH AN ELECTRICALLY CONDUCTIVE WINDOW

[76] Inventors: Robert M. Fletcher, 1520 Huddersfield Ct., San Jose, Calif. 95126; Chihping Kuo, 915 Erie Cir., Milpitas, Calif. 95035; Timothy D. Osentowski, 2920 Creek Point Dr., San Jose, Calif. 95133; Virginia M. Robbins, 112 Grenada Ave., Mountain View, Calif. 94043

[21] Appl. No.: 452,800

[22] Filed: Dec. 18, 1989

[51] Int. Cl.[5] .................... H01L 33/00; H01S 3/19
[52] U.S. Cl. .......................... 357/17; 372/45; 357/16
[58] Field of Search .............. 357/17, 16, 30 E; 372/45

[56] References Cited

U.S. PATENT DOCUMENTS 4,570,172  2/1986  Henry et al. .................. 357/16
4,680,602  7/1987  Watanabe et al. ............. 357/17
4,864,369  9/1989  Snyder et al. ................. 357/16

Primary Examiner—Georgia Epps

[57] ABSTRACT

A light-emitting diode has a semiconductor substrate underlying active p-n junction layers of AlGaInP for emitting light. A transparent window layer of semiconductor different from AlGaInP overlies the active layers and has a lower electrical resistivity than the active layers and a bandgap greater than the bandgap of the active layers, for minimizing current crowding from a metal electrical contact over the transparent window layer. The active layers may be epitaxially grown on a temporary GaAs substrate. A layer of lattice mismatched GaP is then grown on the active layers with the GaP having a bandgap greater than the bandgap of the active layers so that it is transparent to light emitted by the LED. The GaAs temporary substrate is then selectively etched away so that the GaP acts as a transparent substrate. A transparent window layer may be epitaxially grown over the active layers on the face previously adjacent to the GaAs substrate.

14 Claims, 3 Drawing Sheets

LIGHT-EMITTING DIODE WITH AN ELECTRICALLY CONDUCTIVE WINDOW

BACKGROUND

The AlGaInP alloy system has been used for making high quality semiconductor lasers with an emitting wavelength around 670 nanometers. This alloy system may also be useful for making light-emitting diodes (LEDs) in the wavelength range from about 560 to 680 nanometers by adjusting the aluminum to gallium ratio in the active region of the device. Increasing aluminum proportion provides shorter wavelengths. It has also been demonstrated that organometallic vapor phase epitaxy provides means for growing optically efficient AlGaInP heterostructure devices.

In a surface-emitting LED of the type used for the vast majority of LED displays, the device geometry is simple, as shown in FIG. 1. In such a device, there is a GaAs n-type absorbing substrate 10 on which several epitaxial layers are grown to form the LED. First, there is an n-type confining layer of AlGaInP epitaxially grown on the GaAs substrate. An active layer 12 of AlGaInP with an aluminum-gallium ratio selected to provide a desired wavelength of emission is epitaxially grown on the n-type confining layer. The active layer is topped by a p-type confining layer 13, also of AlGaInP. A front electrical contact 14 is provided on the front or emitting face of the LED. A back contact 15 comprises a layer of metal clear across the GaAs substrate. Typically in use, the back electrical contact is mounted on and electrically connected to a metal lead.

Efficient operation of the LED depends on current injected from the metal front contact 14 spreading out laterally to the edges of the LED chip so that light is generated uniformly across the p-n junction. If the sheet resistance of the top layer of semiconductor, namely, the upper p-type confining layer 13, is not low enough, the current does not spread sufficiently and tends to flow directly down beneath the front contact toward the back contact. This type of "current crowding" results in most of the light being generated under the opaque front contact. Much of the light generated in this region is blocked and absorbed within the LED chip, thereby severely limiting the efficiency of the device.

In the usual case of an LED grown with the p-type AlGaInP nearer the top or front surface of the LED, the front layer has a very high resistivity and lateral current flow from the contact is severely restricted. The high resistivity is a result of limited p-type dopant levels that are achievable in AlGaInP and the low hole mobility in such material. Further, resistivity increases as the proportion of aluminum is increased in the alloy, so the problem becomes more acute for short-wavelength LEDs.

The techniques proposed for minimizing the current crowding problem in AlGaInP LEDs have not been completely satisfactory. One technique is to employ patterns of the front metal contact which mechanically aid in spreading the current. Such patterns comprise fingers or grid lines which extend away from the bonding pad to which a wire bond is made. Such techniques are commonly used in LEDs as well as other devices where current spreading is desired. Even so, most of the light generated is under the opaque metal patterns and is blocked. Another technique is to use a transparent front electrical contact such as indium-tin oxide instead of metal. Such transparent electrical contacts have high resistivity and lead to high series resistance in the device.

Because of such shortcomings, it is desirable to provide a technique for distributing current from the front contact to the active p-n junction so that light is emitted more uniformly throughout the junction and device efficiency is enhanced.

BRIEF SUMMARY OF THE INVENTION

There is, therefore, provided in practice of this invention according to a presently preferred embodiment a light-emitting diode having active p-n junction layers of AlGaInP overlain by a transparent window layer of semiconductor different from AlGaInP, with a low resistivity and a bandgap greater than the active layers, so that the overlying layer is transparent to light emitted by the p-n junction. Suitable materials include AlGaAs, GaAsP, and GaP.

A method is also provided for growing a light-emitting diode by epitaxially growing active AlGaInP layers on a GaAs temporary substrate, epitaxially growing on the active layers a layer of semiconductor having a crystal mismatch with GaAs and a bandgap greater than the bandgap of the active layers, and selectively removing the GaAs temporary substrate. This leaves a layer of transparent semiconductor adjacent to the active layers which has sufficient thickness to provide the strength of a substrate.

BRIEF DESCRIPTION OF THE DRAWINGS

These and other features and advantages of the present invention will be appreciated as the same becomes better understood by reference to the following detailed description when considered in connection with the accompanying drawings, wherein.

DESCRIPTION

Figure 1:
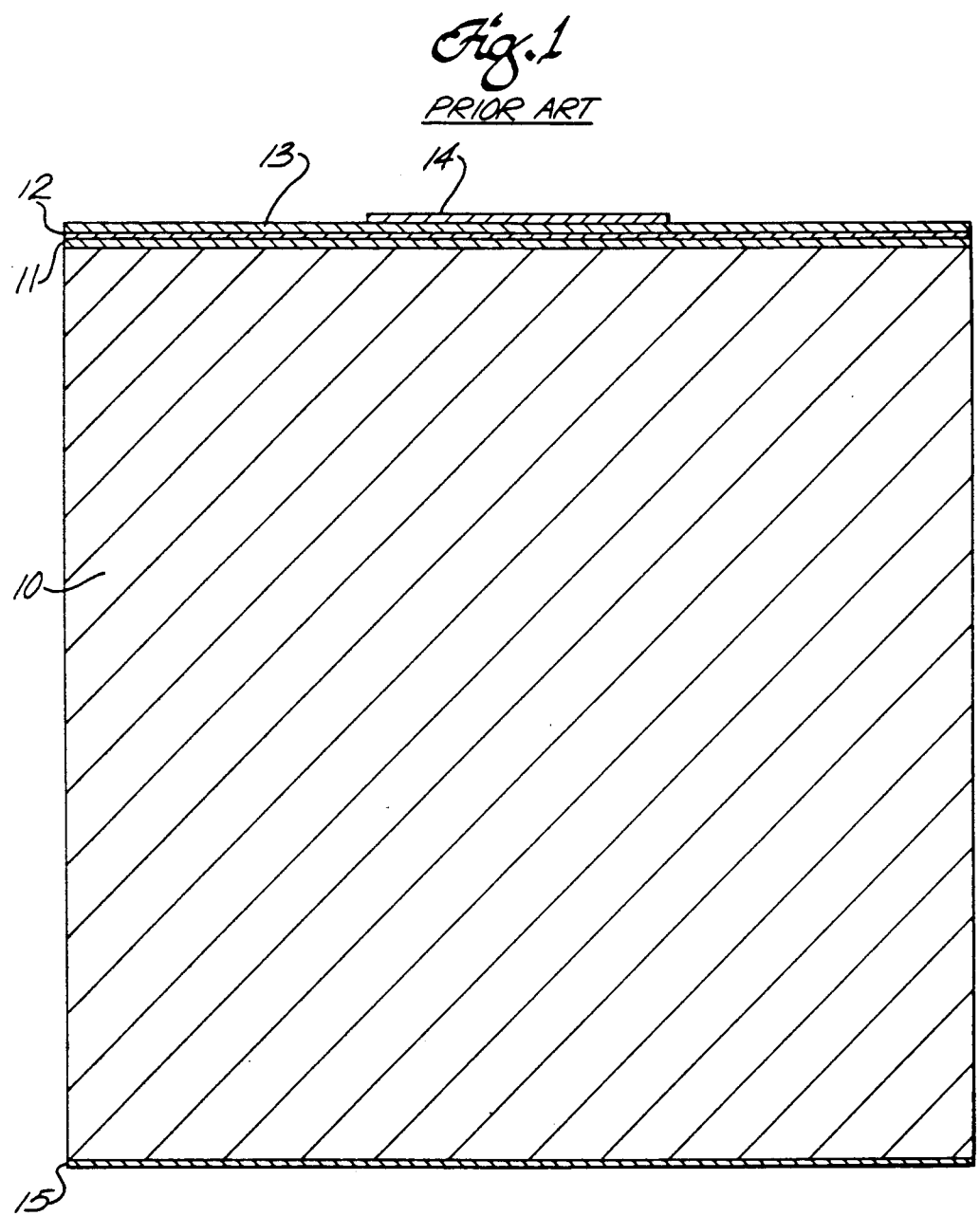
FIG. 1 illustrates in schematic transverse cross-section a light-emitting diode as provided in the prior art.
Figure 2:
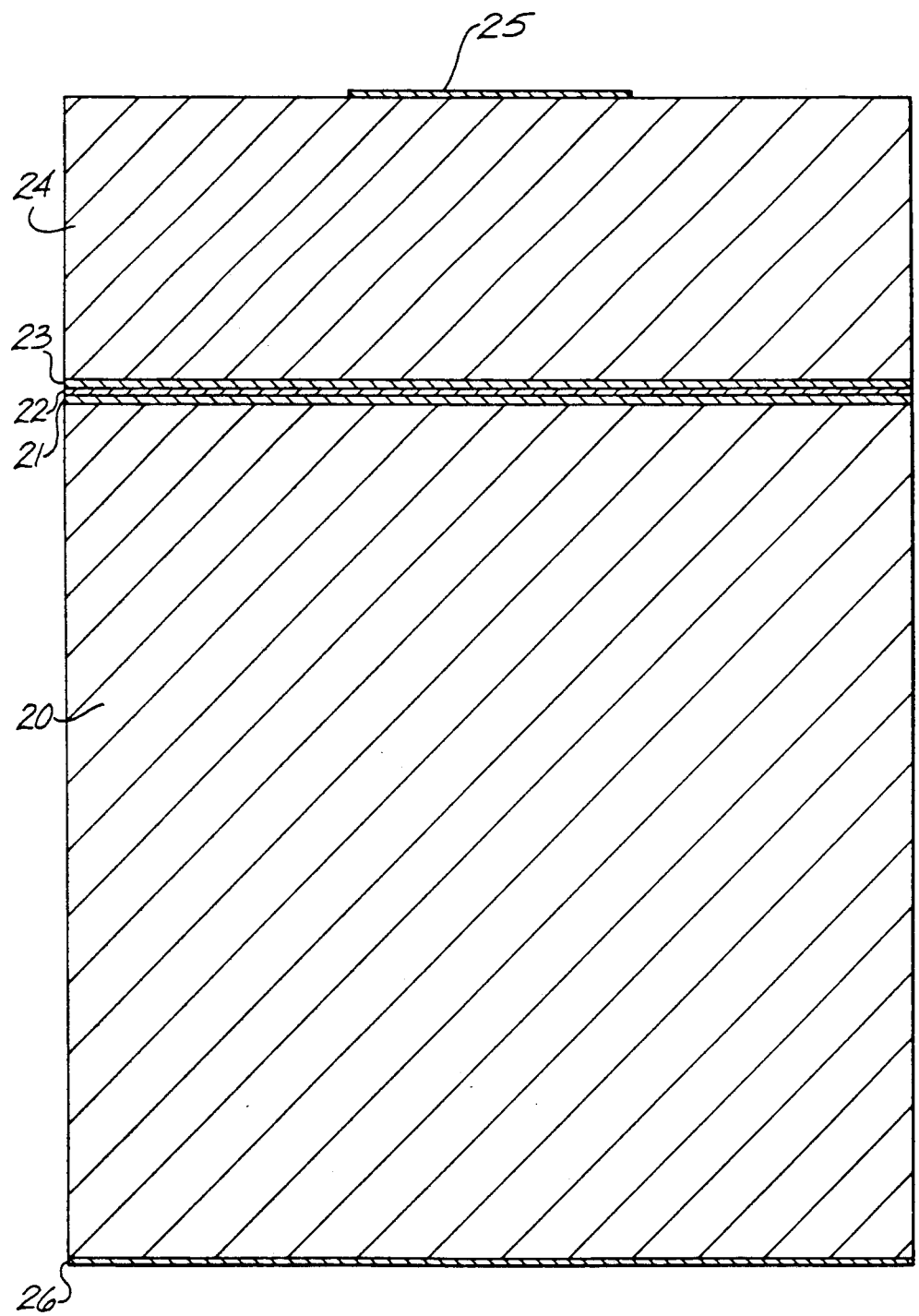
FIG. 2 is a similar schematic transverse cross-section of an AlGaInP light-emitting diode constructed according to principles of this invention.

An exemplary light emitting diode (LED) constructed according to principles of this invention has an n-type substrate 20 of GaAs. On top of the substrate 20, there is a lower n-type confining layer 21 of AlGaInP. The lower confining layer is overlain by an active layer 22 of n-type AlGaInP. The conventional double heterostructure active portion of the LED is completed with an upper p-type confining layer 23 of AlGaInP. These three layers on the substrate are considered the active layers of the device. A conventional back electrical contact 26 is provided on the opposite side of the substrate from the active layers.

In an exemplary embodiment the GaAs substrate may be in the range of from 150 to 200 micrometers thick. The confining layers have an exemplary thickness of 800 nanometers each, and the active layer 22 has an exemplary thickness of 500 nanometers. Zinc or preferably magnesium may be used as a p-type dopant, while tellurium is a suitable n-type dopant.

Overlying the upper confining layer 23 of AlGaInP is a p-type window layer 24 epitaxially grown on the upper confining layer. This layer is a III–V semiconductor alloy different from AlGaInP and having a bandgap greater than that of the active layers of the LED so as to be transparent to the light emitted by the p-n junction of the LED.

The window layer is not only transparent, it has a higher electrical conductivity (lower resistivity) than the AlGaInP. A top or front electrical contact 25 may, therefore, be a conventional circular metal pad in the center of the LED chip. Since the window layer has a high conductivity, it significantly improves LED efficiency by promoting current spreading without blocking the light generated or increasing series resistance.

The thickness of the window layer is not critical, although, generally speaking, thicker windows tend to be desirable. Window thicknesses in the range of from 2 to 30 micrometers are suitable. Relatively thicker windows tend to promote current spreading for a given resistivity material, and they also have the geometric effects of reducing total internal reflection of light within the LED chip and reducing shadowing by the front contact area 25. Preferably, the thickness of the window layer is in the range of from 5 to 15 micrometers.

Suitable materials for the window layer include AlGaAs, which may be lattice matched to the GaAs substrate and may be used for red to orange emitting LEDs. GaAsP and GaP are lattice mismatched and may be used for devices in the yellow to green parts of the spectrum.

The AlGaInP alloy system comprises an essentially continuous range of suitable alloys for making LEDs. The material for the window layer may actually include all four of these elements, but be near the fringes of the quaternary alloy system, and may itself be suitable for forming an active layer in an LED when properly doped. For example, GaP is a suitable material and it will be recognized that this is in a corner of the quaternary system. Addition of small amounts of aluminum and/or indium to this compound theoretically makes it an "AlGaInP" alloy, but it remains different from AlGaInP alloys as used for making LED active layers.

As used herein, AlGaInP alloys have the formula $(Al_xGa_{1-x})_{0.5}In_{0.5}P$ to provide an active layer lattice matched to an opaque GaAs substrate. The range of x is from 0 to 1. In practice in the active layer, x is in the range of from 0 to 0.7. In a double heterostructure LED as described herein, the confining layers also have x in the range of from 0 to 1, however, to obtain a high injection efficiency in the confining layer, x is in the range of from 0.6 to 1. This has the unfortunate effect of increasing resistivity, and the resistivity also is higher for p-type material than n-type. The high resistivity is a problem throughout the composition range, but is particularly severe for shorter wavelengths where the aluminum content is high.

The AlGaInP alloy chosen for the active layer is determined by the color desired. For example, when x=0, the color of the LED is deep red, for x is from 0.3 to 0.4 the color is yellow, and green light is obtained when x is about 0.5. Preferably the resistivity of the transparent window is about an order of magnitude less than the resistivity of the active layers. There is a trade off between resistivity and thickness of the window. A lower resistivity means that the window can be thinner for a given current spreading. A thicker window costs more to grow, hence it is generally desirable to have a lower resistivity to minimize such costs.

As an example, a window layer of GaP approximately six micrometers thick and doped with magnesium to an acceptor level around $1 \times 10^{18} cm^{-3}$ was epitaxially grown on a conventional double heterostructure AlGaInP light-emitting diode. Yellow lamps made from this material produced light output levels as high as 12 lumens/amp at 20 milliamps. Substantially identical lamps made without the GaP window layer produce light levels of only about 2.5 lumens/amp. When the electrically conductive, transparent window is made with a thickness of 15 micrometers, light output levels of about 25 lumens/amp are achieved. Thus, by adding a transparent electrically conductive semiconductor window, the light output performance can be increased from five to ten times the light output from a similar LED without such a window.

Such a window has a resistivity of about 0.05 ohm-centimeter, whereas the top confining layer of such an LED has a resistivity of about 0.5 ohm-centimeter.

The device described has a substrate of GaAs, which is opaque to light in the visible region. The GaAs substrate is employed since AlGaInP can be epitaxially grown on the GaAs substrate with lattice matching over a continuous range of composition between the ternary end points of GaInP and AlInP. Since the GaAs substrate is opaque, it precludes the possibility of collecting light that is emitted out of the back of the active layers.

An alternative transparent substrate is GaP. However, there are no direct bandgap compositions in the AlGaInP system that are lattice matched to GaP, so active layers grown on such a substrate are mismatched by several percent. The strain of this mismatch causes a high dislocation density and the dislocations degrade the optical properties of the AlGaInP.

Figure 3:
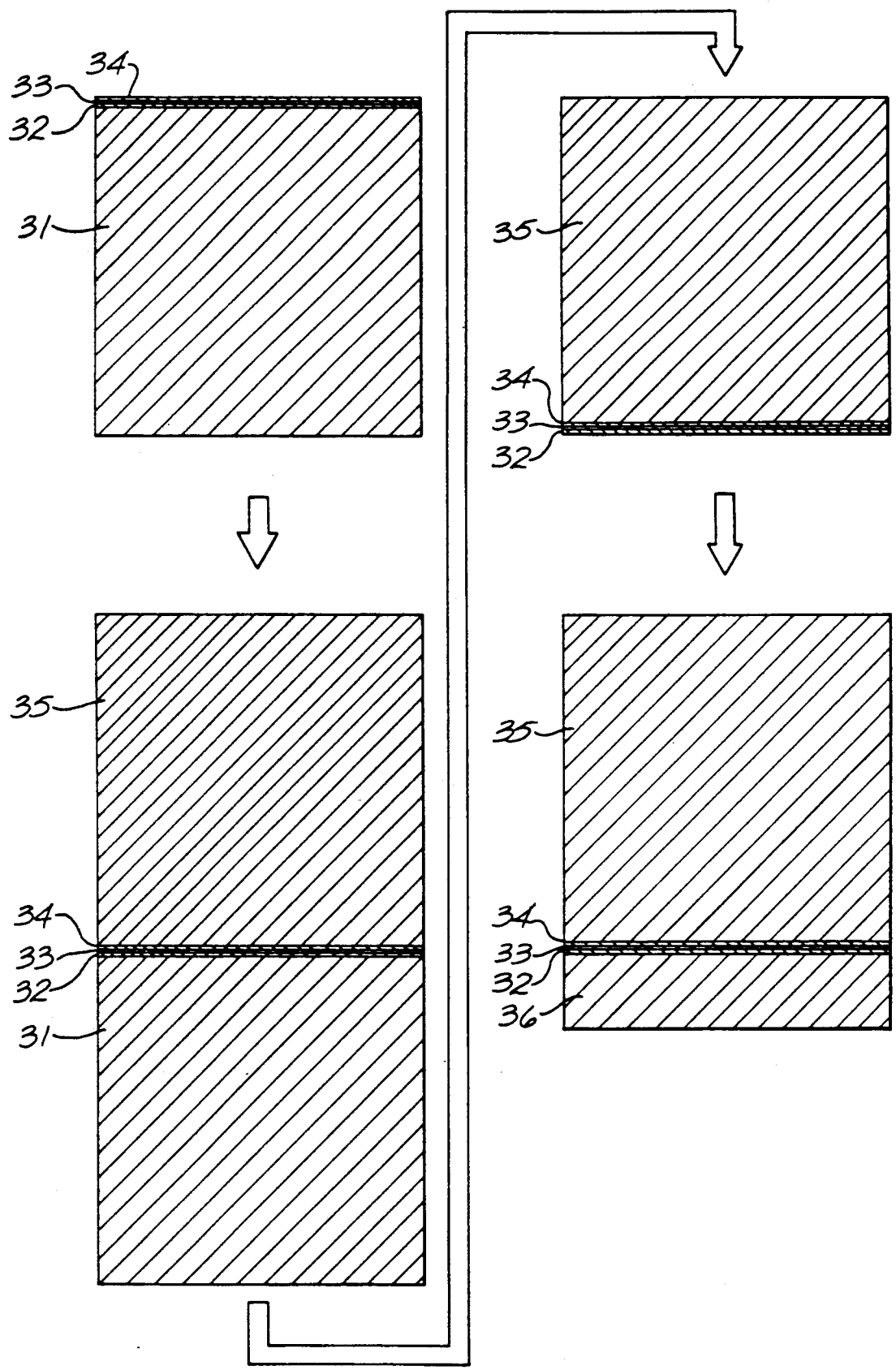
FIG. 3 illustrates schematically in transverse cross-section the product of steps performed during fabrication of a light-emitting diode.

A transparent substrate may, however, be provided for the LED. In a method for making a transparent substrate, a temporary opaque substrate layer 31 of GaAs is employed (FIG. 3). On one face of this substrate, a first confining layer 32 such as n-type AlGaInP is epitaxially grown. An active layer 33 of p-type AlGaInP is epitaxially grown on the first confining layer. A second confining layer 34 of p-type AlGaInP is then epitaxially grown on the active layer. The n- and p-type materials may be reversed and are merely exemplary. The active layers grown on the GaAs substrate are lattice matched with the substrate and therefore have a desirably low dislocation density.

Next, a relatively thick layer 35 of GaP is epitaxially grown on the second confining layer. There is a substantial lattice mismatch between the GaP and the underlying AlGaInP material and with the GaAs substrate. This, however, turns out not to be a significant disadvantage and the GaP remains transparent and a good conductor for making electrical contact with the active layers.

If desired, lattice mismatch in the transition from AlGaInP to GaP may be accommodated over a short distance using linear grading of composition, step changes in composition, superlattices, or combinations of these techniques, as long as the bandgap of the GaP material is greater than the bandgap of the active AlGaInP layers so that the overlying GaP remains transparent to the emission wavelength of the LED. Such lattice matching techniques may also be used in growing a conductive window layer.

The GaP layer is grown at a much higher growth rate than the AlGaInP since dislocations in this layer are of little significance. The GaP layer is also grown much thicker than the active layers to provide a desired mechanical strength for the completed device. Exemplary thickness is in the range of from 150 to 200 micrometers.

After growth of these epitaxial layers the GaAs temporary substrate is removed by selective etching, leaving only the active AlGaInP layers and the relatively thick GaP layer which provides mechanical strength as a transparent "substrate".

Thereafter, if desired, a window layer 36 of GaP, GaAsP or AlGaAs may be epitaxially grown on the face of the first confining layer 32 where the GaAs substrate was removed. The growth wafer can then be processed into individual LED chips by conventional means.

Although limited embodiments of light emitting diode fabricated according to principles of this invention have been described and illustrated herein, many modifications and variations will be apparent to those skilled in the art. The invention has been described in the context of a double heterostructure LED with certain doping of the layers. However, it will be apparent that the technique is suitable for homojunction LEDs and other active devices.

The technique has been described for organometallic vapor phase epitaxial growth. It will be apparent that other growth techniques may also be suitable. Other materials, thicknesses, and the like, may be quite suitable and, therefore, within the scope of the appended claims, this invention may be practiced otherwise than as specifically described.

What is claimed is:

1. A light emitting diode comprising:
    a semiconductor substrate;
    an electrical contact to the substrate;
    active p-n junction layers for AlGaInP over the substrate for emitting light;
    a transparent window layer of semiconductor different from AlGaInP over the active layers and having a bandgap greater than the bandgap of the active layers and a resistivity lower than the active layers; and
    a metal electrical contact over a portion of the transparent layer.

2. A light emitting diode as recited in claim 1 wherein the transparent window layer comprises GaAsP.

3. A light emitting diode as recited in claim 1 wherein the transparent window layer comprises GaP.

4. A light emitting diode as recited in claim 1 wherein the transparent window layer comprises AlGaAs.

5. A light emitting diode as recited in claim 1 wherein the transparent window layer comprises a p-type semiconductor.

6. A light emitting diode as recited in claim 1 wherein the transparent window layer has a resistivity at least an order of magnitude less than the resistivity of the AlGaInP.

7. A light emitting diode as recited in claim 1 wherein the substrate comprises GaAs.

8. A light emitting diode comprising:
    an opaque semiconductor substrate;
    an electrical contact to the substrate;
    a first confining layer of a first conductivity type AlGaInP on the substrate;
    an active layer of a first conductivity type AlGaInP on the first confining layer;
    a second confining layer of a second conductivity type AlGaInP on the active layer;
    a transparent window layer of semiconductor different from AlGaInP over the second confining layer and having a lower resistivity than the second confining layer and a bandgap greater than the bandgap of the active layer; and
    a metal electrical contact over a portion of the transparent window layer.

9. A light emitting diode as recited in claim 8 wherein the transparent window layer comprises GaAsP.

10. A light emitting diode as recited in claim 8 wherein the transparent window layer comprises GaP.

11. A light emitting diode as recited in claim 8 wherein the transparent window layer comprises AlGaAs.

12. A light emitting diode as recited in claim 8 wherein the transparent window layer comprises a second conductivity type semiconductor.

13. A light emitting diode as recited in claim 8 wherein the transparent window layer has a resistivity at least an order of magnitude less than the resistivity of the AlGaInP.

14. A light emitting diode as recited in claim 8 wherein the substrate comprises GaAs.

* * * * *